(12) United States Patent
Shiode (10) Patent No.: US 9,798,231 B2
(45) Date of Patent: Oct. 24, 2017

(54) IMPRINT APPARATUS AND METHOD OF MANUFACTURING ARTICLE

(71) Applicant: CANON KABUSHIKI KAISHA, Tokyo (JP)

(72) Inventor: Yoshihiro Shiode, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 187 days.

(21) Appl. No.: 14/372,595

(22) PCT Filed: Jan. 9, 2013

(86) PCT No.: PCT/JP2013/050703
§ 371 (c)(1),
(2) Date: Jul. 16, 2014

(87) PCT Pub. No.: WO2013/118547
PCT Pub. Date: Aug. 15, 2013

(65) Prior Publication Data
US 2014/0367875 A1    Dec. 18, 2014

(30) Foreign Application Priority Data

Feb. 7, 2012 (JP) .................................. 2012-024521

(51) Int. Cl.
*G03F 7/00* (2006.01)
*G03F 9/00* (2006.01)
(Continued)

(52) U.S. Cl.
CPC .......... *G03F 7/0002* (2013.01); *B29C 59/026* (2013.01); *B82Y 10/00* (2013.01);
(Continued)

(58) Field of Classification Search
None
See application file for complete search history.

(56) References Cited

U.S. PATENT DOCUMENTS 5,669,303 A  *  9/1997  Maracas ................. B05C 1/027
                                                              101/327
6,900,881 B2 *  5/2005  Sreenivasan ........ B29C 35/0888
                                                            257/E21.024
(Continued)

FOREIGN PATENT DOCUMENTS

CN       101316693 A       12/2008
CN       101394989 A        3/2009
(Continued)

OTHER PUBLICATIONS

Office Action issued in CN201380007880.9, mailed Dec. 17, 2015. English translation provided.
(Continued)

*Primary Examiner* — Benjamin Schiffman
(74) *Attorney, Agent, or Firm* — Rossi, Kimms & McDowell LLP (57) ABSTRACT

The present invention provides an imprint apparatus comprising a deforming unit configured to deform a pattern surface by applying a force to a mold, a measuring unit configured to measure a deformation amount of the pattern surface, a control unit configured to control the measuring unit to measure the deformation amount in each of a plurality of states in which a plurality of the forces are applied to the mold, a calculation unit configured to calculate a rate of change in the deformation amount as a function of a change in the force applied to the mold, and a calibration unit configured to calibrate a control profile describing a time in the imprint process, and the force applied to the mold, based on the rate of change in the deformation amount.

14 Claims, 7 Drawing Sheets

(51) Int. Cl.
*G11B 5/855* (2006.01)
*B82Y 10/00* (2011.01)
*B82Y 40/00* (2011.01)
*B29C 59/02* (2006.01)
*B29K 101/00* (2006.01)

(52) U.S. Cl.
CPC .............. *B82Y 40/00* (2013.01); *G03F 9/703* (2013.01); *G03F 9/7023* (2013.01); *G03F 9/7049* (2013.01); *G11B 5/855* (2013.01); *B29C 2059/023* (2013.01); *B29K 2101/00* (2013.01)

(56) References Cited

U.S. PATENT DOCUMENTS

| | | | |
|---|---|---|---|
| 7,691,313 B2* | 4/2010 | Choi | B29C 43/003 264/102 |
| 7,803,308 B2 | 9/2010 | GanapathiSubramanian et al. | |
| 8,834,144 B2 | 9/2014 | Nakamura et al. | |
| 8,953,175 B2 | 2/2015 | Sato | |
| 2008/0160129 A1 | 7/2008 | Resnick et al. | |
| 2010/0244326 A1 | 9/2010 | Tokue et al. | |
| 2011/0229988 A1 | 9/2011 | Asano et al. | |

FOREIGN PATENT DOCUMENTS

| | | |
|---|---|---|
| EP | 1669802 A2 | 6/2006 |
| JP | 2008279772 A | 11/2008 |
| JP | 2009517882 A | 4/2009 |
| JP | 2009536591 A | 10/2009 |
| JP | 2011127979 A | 6/2011 |
| JP | 2011199052 A | 10/2011 |
| WO | 2007064386 A1 | 6/2007 |
| WO | 2007132320 A2 | 11/2007 |

OTHER PUBLICATIONS

International Search Report issued in PCT/JP2013/050703, dated Feb. 19, 2013. (Form PCT/ISA/210).
Written Opinion issued in PCT/JP2013/050703, dated Feb. 19, 2013. (Form PCT/ISA/237).
Korean Office Action issued in counterpart application No. KR10-2014-7024273, dated Dec. 10, 2015.

* cited by examiner

IMPRINT APPARATUS AND METHOD OF MANUFACTURING ARTICLE

TECHNICAL FIELD

The present invention relates to an imprint apparatus and a method of manufacturing an article.

BACKGROUND ART

The imprint technique is attracting a great deal of attention as one of nano-lithography techniques for volume production of, for example, magnetic storage media and semiconductor devices. In the imprint technique, a pattern is transferred onto a substrate such as a silicon wafer or a glass plate using, as an original, a mold having a fine pattern formed on it.

An imprint apparatus which uses such an imprint technique presses a mold against a substrate via a resin (imprint material) supplied on the substrate, and cures the resin in this state. The imprint apparatus then separates the mold from the cured resin to transfer the pattern of the mold onto the substrate. At this time, it is necessary to prevent loss of the pattern transferred onto the substrate. To meet this requirement, Japanese Patent Laid-Open Nos. 2009-536591 and 2009-517882 propose techniques of deforming (curving) the mold so as to form a convex surface that bulges toward the substrate in bringing the mold into contact with the resin on the substrate, or separating the mold from the cured resin.

An imprint apparatus generally uses a plurality of molds, each of which is applied with a predetermined force to deform each mold in the same amount (in a predetermined amount) in a mold deforming operation (that is, in an imprint process). However, the thickness of each mold varies due, for example, to manufacturing errors and dimension errors. Therefore, when the force to be applied to each mold remains the same, the deformation amount of each mold in an imprint process varies. As a result, the dimension and shape of the pattern transferred onto the substrate vary across individual molds, or loss is generated in the transferred pattern.

SUMMARY OF INVENTION

The present invention provides a technique advantageous in terms of pattern transfer accuracy in an imprint apparatus.

According to one aspect of the present invention, there is provided an imprint apparatus which performs an imprint process of curing a resin on a substrate while a mold having a pattern surface on which a pattern is formed is pressed against the resin, and separating the mold from the cured resin, thereby transferring the pattern onto the substrate, the apparatus comprising: a deforming unit configured to deform the pattern surface by applying a first force to the mold; a first measuring unit configured to measure a deformation amount of the pattern surface; a control unit configured to control the first measuring unit to measure the deformation amount of the pattern surface in each of a plurality of states in which a plurality of first forces are applied to the mold by the deforming unit; a calculation unit configured to calculate a rate of change in deformation amount of the pattern surface as a function of a change in first force applied to the mold by the deforming unit, based on a relationship between each of the plurality of first forces applied to the mold and the deformation amount of the pattern surface corresponding to each of the plurality of first forces; and a calibration unit configured to calibrate a first control profile describing a time in the imprint process, and a first force to be applied to the mold by the deforming unit, based on the rate of change in deformation amount of the pattern surface calculated by the calculation unit, so that the deformation amount of the pattern surface in the imprint process becomes a target amount.

Further features of the present invention will become apparent from the following description of exemplary embodiments with reference to the attached drawings.

DESCRIPTION OF EMBODIMENTS

Exemplary embodiments of the present invention will be described below with reference to the accompanying drawings. Note that the same reference numerals denote the same members throughout the drawings, and a repetitive description thereof will not be given.

First Embodiment

Figure 1:
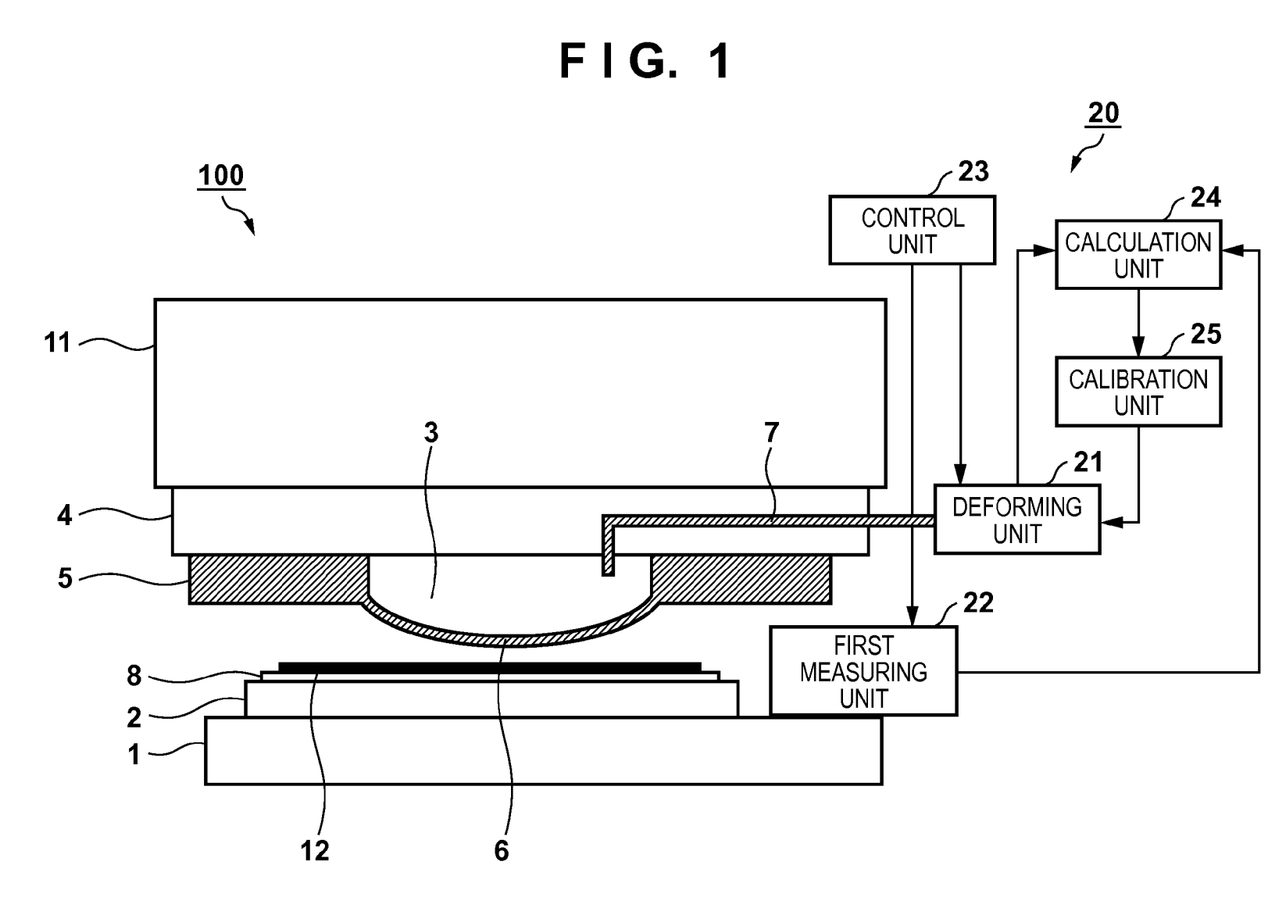
FIG. 1 is a view showing the configuration of an imprint apparatus according to the first embodiment of the present invention.

An imprint apparatus 100 according to the first embodiment of the present invention will be described with reference to FIG. 1. The imprint apparatus 100 performs an imprint process of curing a resin on a substrate while a mold having a pattern formed on it is pressed against the resin, and separating the mold from the cured resin, thereby transferring the pattern onto the substrate.

The imprint apparatus 100 includes a holding unit 4 which holds a mold 5, a structure 11, a substrate stage 1, and a substrate chuck 2. The imprint apparatus 100 also provides a deforming unit 21, first measuring unit 22, control unit 23, calculation unit 24, and calibration unit 25, as a control system 20 which performs an imprint process upon deforming the mold 5.

The mold 5 is held by the holding unit 4, and has a pattern surface 6 on which a pattern is formed. The surface of the mold 5, which is opposite to the pattern surface 6, contacts the holding surface of the holding unit 4. Also, the mold 5 has a concave portion formed by drilling its surface on the side of the holding surface so as to reduce the thickness of the portion in which the pattern is formed (pattern surface 6). By reducing the thickness of the portion in which the pattern is formed, that is, the pattern surface 6, the pattern surface 6 of the mold 5 can easily deform when a pressure is applied to a chamber 3 (to be described later).

The concave portion formed in the mold 5 forms a practically airtightly sealed space in cooperation with the holding surface of the holding unit 4. The space formed by the concave portion in the mold 5, and the holding surface of the holding unit 4 will be referred to as a chamber 3 hereinafter. A pipe 7 is formed in the holding unit 4 to communicate with the chamber 3. The pipe 7 is connected to the deforming unit 21. The deforming unit 21 is implemented by a pressure controller including, for example, a servo valve and a switching valve for switching between a supply source which supplies compressed air to the chamber 3 and that which evacuates the chamber 3 to a vacuum. The deforming unit 21 applies a first force to the mold 5 using the pressure in the chamber 3.

The holding unit 4 is attached to the structure 11 and driven in the Z-direction (vertically) by a driving source and a control mechanism (neither is shown) to bring a substrate 8 and the mold 5 close to each other or separate them from each other. The substrate 8 is held by the substrate stage 1, which is capable of moving in the X- and Y-directions, through the substrate chuck 2.

In an imprint process, the imprint apparatus 100 deforms the mold 5 using the pressure in the chamber 3 so that the pattern surface 6 forms a convex surface that bulges toward the substrate 8.

Figure 2:
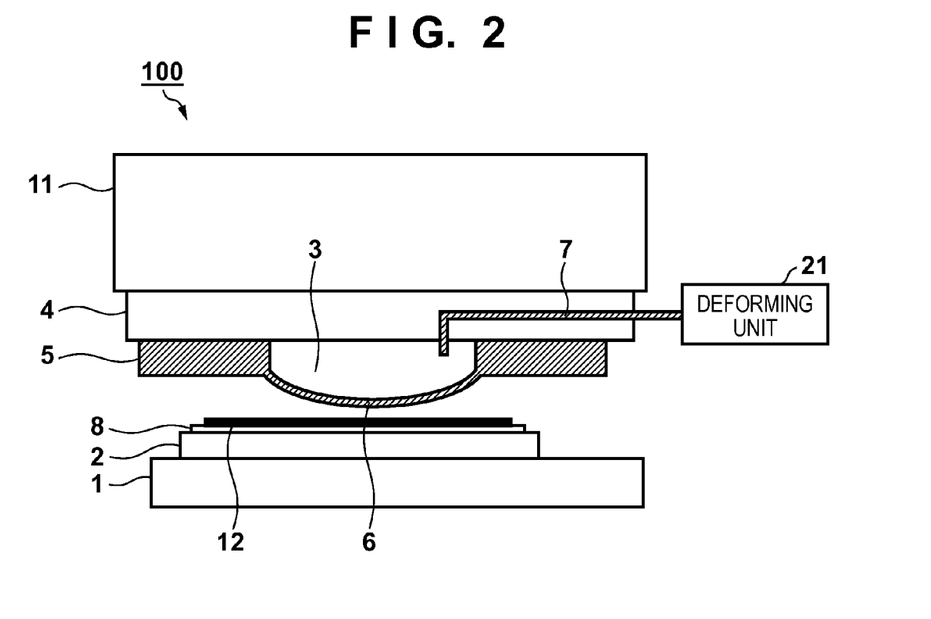
FIG. 2 is a view showing the imprint apparatus according to the first embodiment of the present invention before a mold is pressed against a resin on a substrate.
Figure 3:
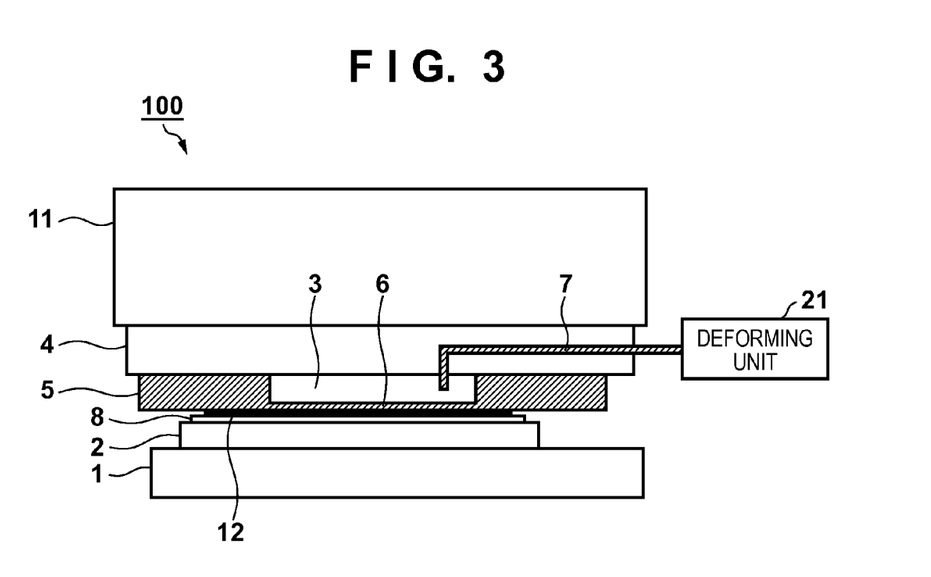
FIG. 3 is a view showing the imprint apparatus according to the first embodiment of the present invention while the mold is pressed against the resin on the substrate.

FIGS. 2 and 3 show the sequence of a series of operations until the mold 5 is pressed against a resin 12 on the substrate 8 in an imprint process. Referring to FIG. 2, the substrate 8 dispensed with the resin 12 is arranged below the mold 5. In this state, the deforming unit 21 applies a pressure to the chamber 3 to deform the mold 5 so that the pattern surface 6 forms a convex shape to bulge toward the substrate 8. At this time, the pattern surface 6 of the mold 5 is not in contact with the resin 12 on the substrate 8. In pressing the mold 5 against the resin 12 on the substrate 8, first, the holding unit 4 is lowered in the Z-direction to bring the central portion of the pattern surface 6 of the mold 5 into contact with the resin 12 on the substrate 8. Upon this operation, the control mode of the holding unit 4 is switched from position control to force control. The pattern surface 6 of the mold 5 is continuously brought into contact with the resin 12 while the pressure in the chamber 3 is gradually weakened outwards from its central portion. Eventually, the deforming unit 21 changes the pressure in the chamber 3 to the degree that the pattern surface 6 of the mold 5 becomes flat, as shown in FIG. 3. In this state, the process waits until the pattern of the mold 5 is filled with the resin 12. After the pattern of the mold 5 is filled with the resin 12, the resin 12 is irradiated with ultraviolet rays to cure it. After the resin 12 cures upon being irradiated with ultraviolet rays, the mold 5 is separated from the cured resin 12. In separating the mold 5 from the cured resin 12, the cured resin 12 and the pattern surface 6 have adhered to each other, so the pattern surface 6 deforms into a convex surface that bulges toward the substrate 8 as the mold 5 is pulled toward the substrate 8. Hence, in separating the mold 5 from the cured resin 12, the deforming unit 21 gradually weakens the pressure in the chamber 3.

Figure 4:
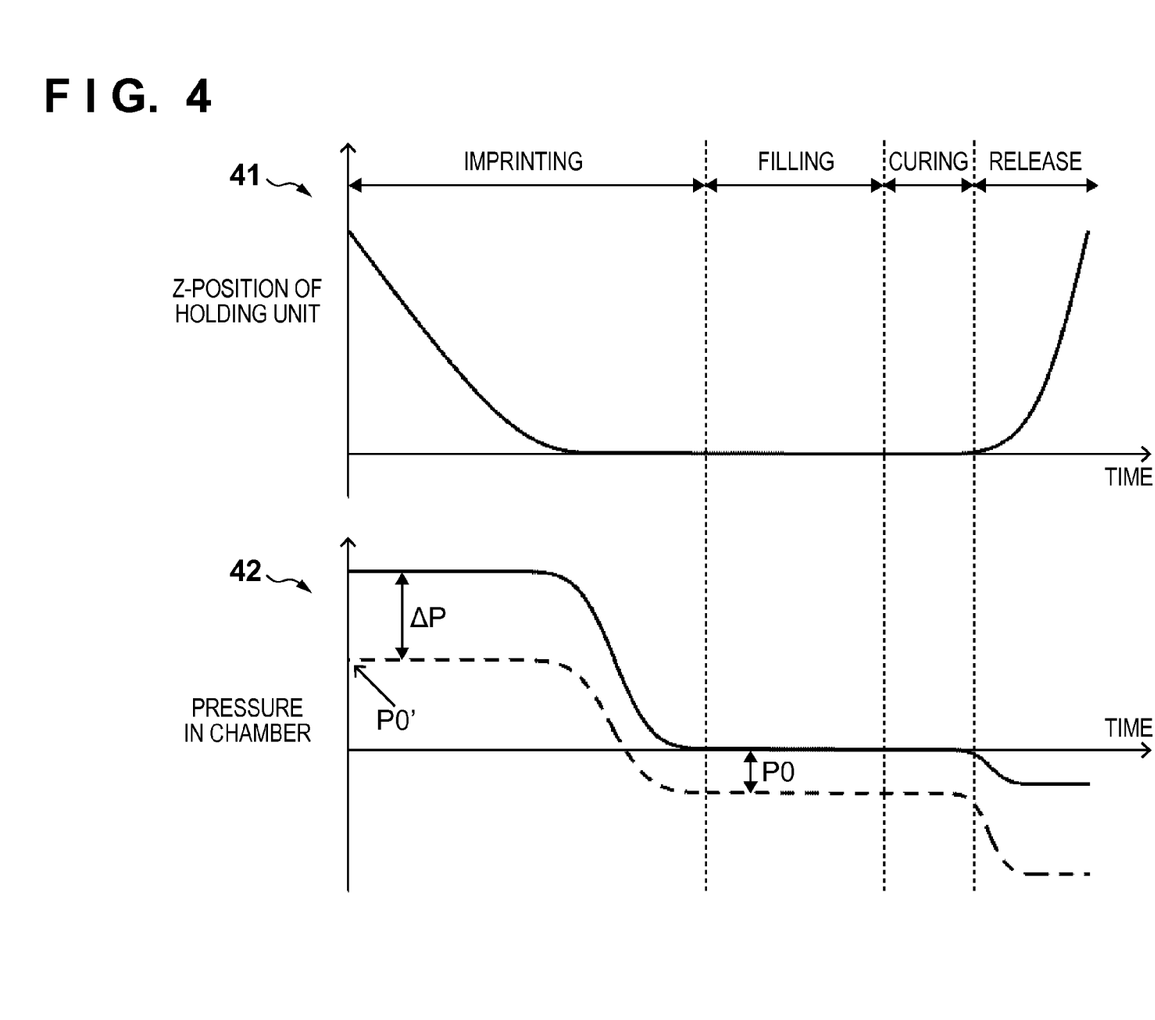
FIG. 4 shows graphs of first control profiles describing the relationships between the time during an imprint process, and the Z-position of a holding unit and the pressure in a chamber, respectively, at this time.

In the above-mentioned imprint process, the characteristics of driving control of the holding unit 4 in the Z-direction and pressure control of the chamber 3 are stored in the imprint apparatus 100 as control profiles in advance. FIG. 4 shows graphs of control profiles describing the relationships between the time and the Z-position of the holding unit 4 and the pressure in the chamber 3, respectively. Referring to FIG. 4, a graph 41 shows a control profile describing the relationship between the time and the Z-position of the holding unit 4, and a graph 42 shows a control profile describing the relationship between the time and the pressure in the chamber 3. Note that the time of imprinting is defined from the start of lowering the mold 5 in the Z-direction until the entire pattern surface of the mold 5 comes into contact with the resin 12 on the substrate 8. Also, the time of release is defined from the start of lifting the mold 5 in the Z-direction until the pattern surface of the mold 5 separates from the resin 12. At the time of imprinting, when the Z-position of the holding unit 4 has a negative gradient, the chamber 3 is maintained at a predetermined pressure at which the pattern surface 6 of the mold 5 deforms into a convex shape to bulge toward the substrate 8. In the period from when the central portion of the pattern surface 6 of the mold 5 is brought into contact with the resin 12 on the substrate 8 until this central portion is pressed against the resin 12, the mold 5 and the resin 12 on the substrate 8 assume a state shown in FIG. 3, in which the pressure in the chamber 3 gradually weakens while the Z-position of the holding unit 4 remains the same. At the time of release, the mold 5 is separated from the cured resin 12, so the Z-position of the holding unit 4 has a positive gradient, and the pressure in the chamber 3 gradually weakens at that time. Loss of the pattern transferred onto the substrate 8 can be prevented by controlling the pressure in the chamber 3 at the time of imprinting or release in this way.

Figure 5:
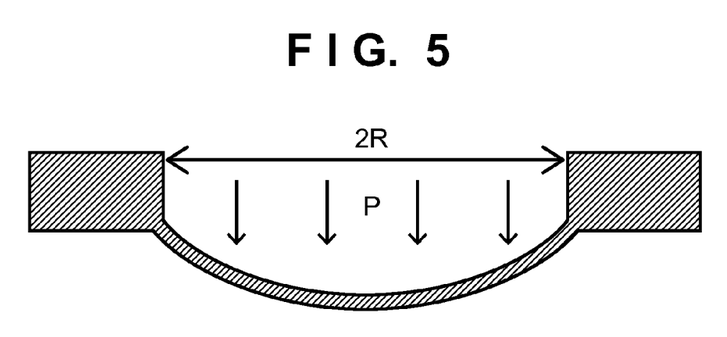
FIG. 5 is a sectional view of a mold.

The imprint apparatus 100 generally uses a plurality of exchangeable molds 5. Each of the plurality of molds 5 transmits ultraviolet light, and is therefore manufactured by machining silica glass. Hence, the thickness of each mold 5 varies due, for example, to manufacturing errors and dimension errors. This means that when the first control profile of each mold 5 remains the same, the deformation amount of the pattern surface 6 (the difference in shape of the central portion of the pattern surface 6 when the pattern surface 6 is flat and when it has deformed) varies across individual molds 5 due to factors associated with the thickness (its difference) of each mold 5. As a result, the dimension and shape of the pattern transferred onto the substrate 8 also vary across individual molds 5. When a mold 5 having a cross-sectional shape as shown in, for example, FIG. 5 is used, a deformation amount Wmax of the pattern surface 6 as a function of the thickness of the mold 5 upon a change in pressure of the chamber 3 is given by:

$$W\max = \frac{P \cdot R^4}{64} \cdot \frac{12(1-v^2)}{E \cdot t^3}$$

where 2R is the diameter of the concave portion in the mold 5 shown in FIG. 5 and is 64 mm, t is the thickness of the mold 5 and is 1.0 to 1.2 mm, P is the pressure in the chamber 3 and is 10, 30, and 50 kPa, E is the longitudinal elastic modulus of the mold 5 and is 71,500 N/mm$^2$, and v is the Poisson's ratio and is 0.335.

Figure 6:
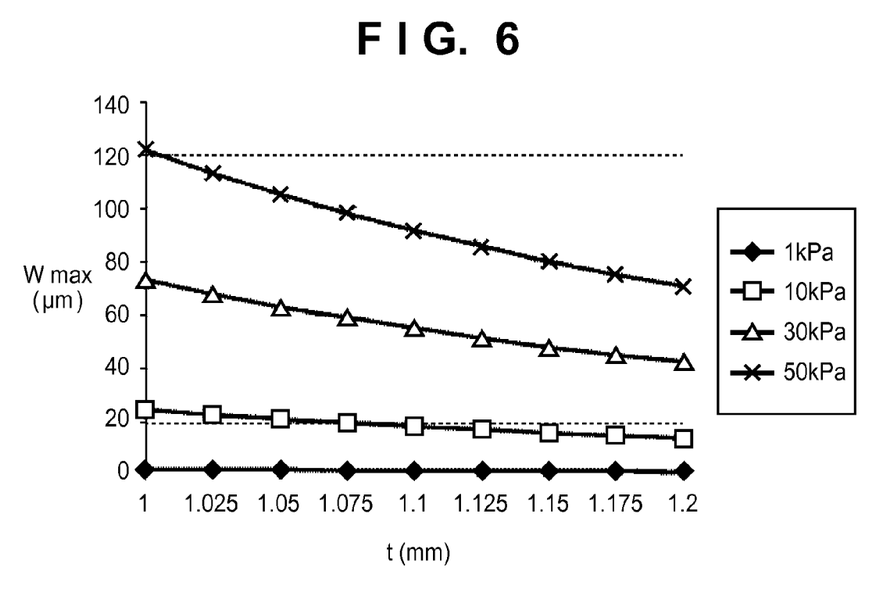
FIG. 6 is a graph showing the relationship between the thickness of the mold and the deformation amount of a pattern surface.

FIG. 6 shows the relationship between the thickness of the mold 5 and the deformation amount of the pattern surface 6. As can be seen from FIG. 6, when the thickness t of the mold 5 changes while the pressure P in the chamber 3 remains the same, the deformation amount Wmax of the pattern surface 6 changes in inverse proportion to the cube of the thickness t of the mold 5. This change becomes more conspicuous as the pressure P in the chamber 3 increases. In this manner, even when the error of the thickness of the mold 5 is controlled to fall within a tolerance of Target Thickness ±0.025 mm, an error occurs in the deformation amount of the pattern surface 6 in each mold 5.

For this reason, the imprint apparatus 100 provides the deforming unit 21, first measuring unit 22, control unit 23, calculation unit 24, and calibration unit 25, as the control system 20.

In this embodiment, the deforming unit 21 changes the pressure in the chamber 3 to change a first force applied to the mold 5. The control unit 23 controls the first measuring unit 22 to measure the deformation amount of the pattern surface 6 while each of a plurality of first forces is applied to the mold 5 by the deforming unit 21. The calculation unit 24 calculates the rate of change in deformation amount of the pattern surface 6 as a function of the change in first force applied to the mold 5, based on the relationship between each of a plurality of first forces applied to the mold 5 and the deformation amount of the pattern surface 6 corresponding to each of the plurality of first forces. Based on the rate of change in deformation amount of the pattern surface 6, the calibration unit 25 calibrates a first control profile describing the relationship between the time in an imprint process and the first force to be applied to the mold 5 by the deforming unit 21 at this time, so that the deformation amount of the pattern surface 6 becomes a target amount. The deforming unit 21 applies a first force to the mold 5 based on the first control profile calibrated by the calibration unit 25. In this embodiment, the first measuring unit 22, control unit 23, calculation unit 24, and calibration unit 25 can set the deformation amount of the pattern surface 6 of each mold 5 to a target amount in an imprint process even if the thickness of each mold 5 varies.

An example of an imprint process by the imprint apparatus 100 according to the first embodiment will be described below. In this case, a mold 5 actually used in an imprint process is defined as a mold A. Also, the pressure in the chamber 3 is regarded to be equivalent to the force applied to the mold A.

Figure 7:
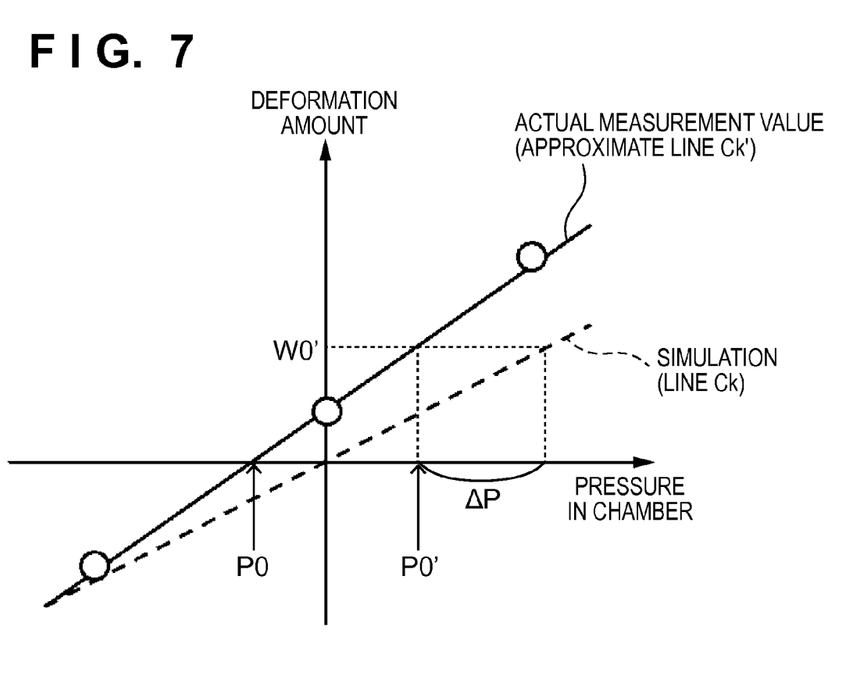
FIG. 7 is a graph showing the relationship between the pressure in the chamber and the deformation amount of the pattern surface in the imprint apparatus according to the first embodiment of the present invention.

While the pressure in the chamber 3 is set to a first pressure P1 by the deforming unit 21, the first measuring unit 22 measures a deformation amount W1 of the pattern surface 6 of the mold A. Similarly, the first measuring unit 22 measures a deformation amount W2 of the pattern surface 6 while the pressure in the chamber 3 is set to a second pressure P2, and a deformation amount W3 of the pattern surface 6 while the pressure in the chamber 3 is set to a third pressure P3. FIG. 7 shows the relationship between the three pressures P1, P2, and P3 in the chamber 3, and the corresponding deformation amounts W1, W2, and W3 of the pattern surface 6. FIG. 7 shows the pressure in the chamber 3 on the abscissa, and the deformation amount of the pattern surface 6 on the ordinate.

Figure 8:
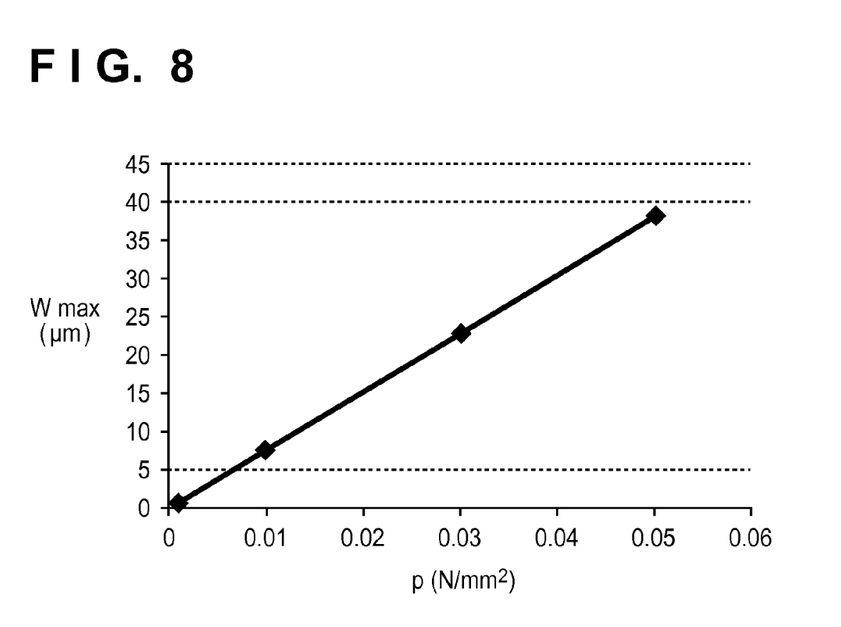
FIG. 8 is a graph showing the result of calculating the relationship between the pressure in the chamber and the deformation amount of the pattern surface.

FIG. 8 shows the result of calculating by simulation the deformation amount (target amount) of the pattern surface 6 of a reference mold (thickness: 1.1 mm) when a pressure is applied to the chamber 3. The pressure in the chamber 3 and the deformation amount of the pattern surface 6 have an approximately linear relationship (proportional relationship). Accordingly, since the three actual measurement values shown in FIG. 7 can be represented by linear approximation, the calculation unit 24 can calculate, from these three actual measurement values, a rate of change (approximate line) Ck' of the deformation amount of the pattern surface 6 as a function of the change in pressure of the chamber 3. Also, the calculation unit 24 can calculate the pressure in the chamber 3, which is required to set the deformation amount of the pattern surface 6 to a target amount, based on the approximate line Ck'. This target amount is determined from the deformation amount of the pattern surface 6 in an imprint process using the reference mold. In filling the pattern of the mold 5 with the resin 12, the pattern surface 6 must be flat. The target amount for the deformation amount of the pattern surface 6 at this time is on the X-axis shown in FIG. 7, that is, zero, so a pressure P0 in the chamber 3, at which the deformation amount of the pattern surface 6 is zero, can be calculated from the approximate line Ck'. Also, it is necessary to deform the pattern surface 6 into a convex shape until the mold 5 comes into contact with the resin 12 on the substrate 8 at the time of imprinting. Letting W0' be the target amount for the deformation amount of the pattern surface 6 at this time, a pressure P0' in the chamber 3, at which the deformation amount of the pattern surface 6 is set to the target amount W0', can be calculated. Note that FIG. 7 shows the simulation result of the reference mold, shown in FIG. 8, together with the approximate line of the actual measurement value, which is defined as a line Ck.

The calibration unit 25 calibrates the first control program using the slope of the approximate line Ck' calculated by the calculation unit 24, and the pressures P0 and P0' in the chamber 3, so that the deformation amount of the mold A becomes the deformation amount (target amount) of the reference mold in an imprint process. Calibration of the first control profile will be explained with reference to the graph 42 shown in FIG. 4. A solid line indicates a first control profile corresponding to the reference mold, and a broken line indicates a first control profile corresponding to the mold A. Referring to FIG. 7, the pressure in the chamber 3, at which the deformation amount of the pattern surface of the mold A is set to the target amount W0', is P0', and its difference from the pressure of the chamber 3 when the deformation amount of the pattern surface of the reference mold is the target amount W0' is ΔP. Hence, until the mold A comes into contact with the resin 12 at the time of imprinting in FIG. 4, the force applied to the reference mold (that is, the force applied to the chamber 3) is set lower than that applied to the mold A by ΔP. ΔP can be calculated from the line Ck for the reference mold and the approximate line Ck' for the mold A. Similarly, in filling the pattern of the mold A with the resin 12, to flatten the pattern surface, the force applied to the mold A is set lower than that applied to the reference mold by P0. In the period from when the mold A comes into contact with the resin 12 until the start of filling the pattern of the mold A with the resin 12 at the time of imprinting, and at the time of release, the rate of change in force applied to the mold A (in pressure of the chamber 3) is changed based on the slope of the approximate line Ck'.

In the first embodiment, the deformation amount of the pattern surface 6 while each of a plurality of first forces is applied to the mold 5 is measured to obtain the relationship between each of the plurality of first forces applied to the mold 5, and the deformation amount of the pattern surface 6 corresponding to each of the plurality of first forces. The rate of change in deformation amount of the pattern surface 6 as a function of the change in first force applied to the mold 5 is calculated from this relationship. A first control profile describing the relationship between the time in an imprint process, and the first force to be applied to the mold 5 at this time is calibrated based on the calculated rate of change in deformation amount of the pattern surface 6. With this operation, even if the thickness of each mold 5 varies, an imprint process can be performed upon deforming the pattern surface of each mold 5 as in the reference mold. Although the line Ck for the reference mold is determined from the simulation result in the first embodiment, it may be determined from an actual measurement value. In this case, the line Ck may not pass through the origin. When this happens, it is necessary to calibrate the first control profile in consideration of the first force applied to the mold (the pressure in the chamber 3) when the deformation amount of the pattern surface 6 of the reference mold is zero.

Second Embodiment

Figure 9:
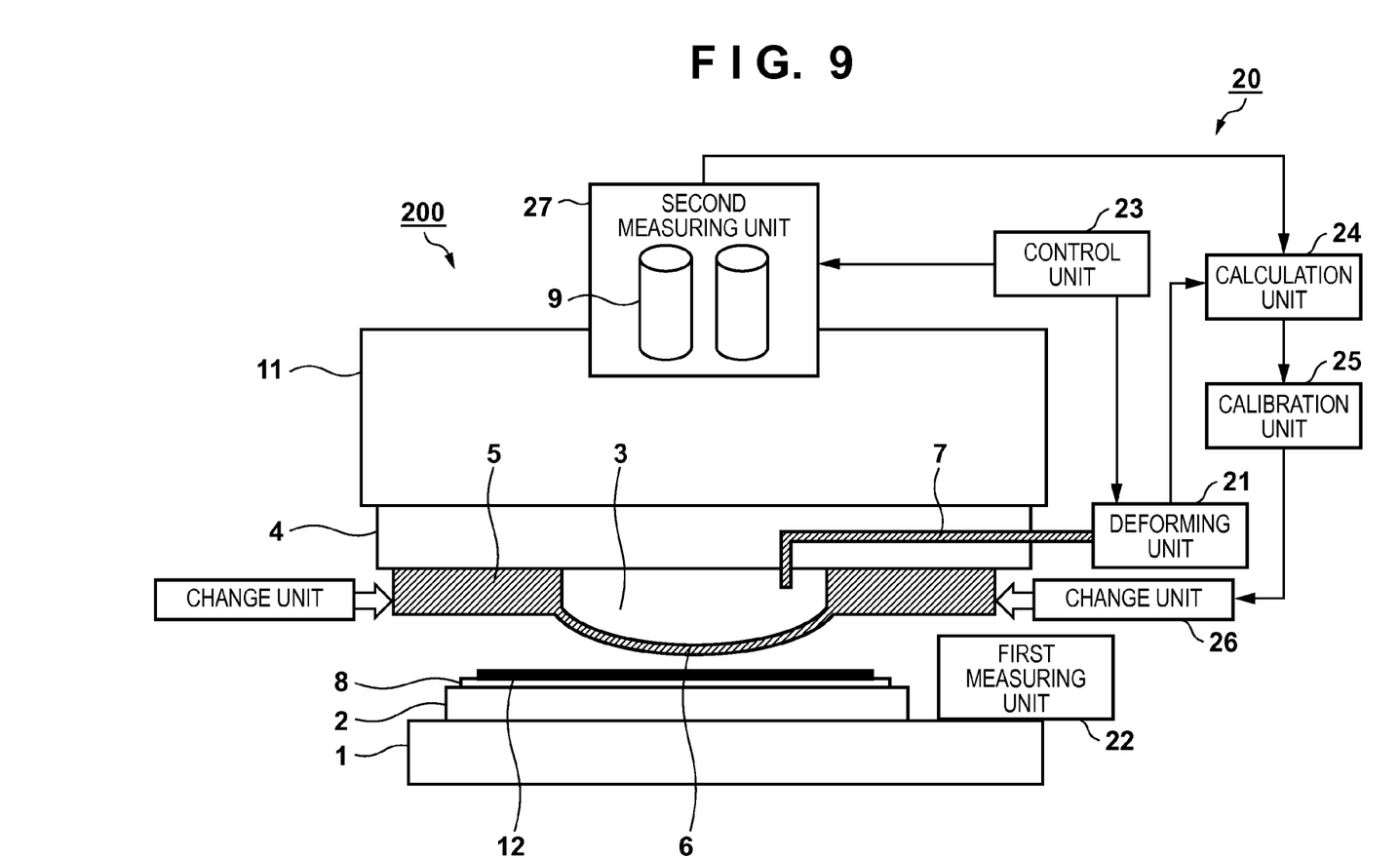
FIG. 9 is a view showing the configuration of an imprint apparatus according to the second embodiment of the present invention.

An imprint apparatus 200 according to the second embodiment of the present invention will be described with reference to FIG. 9. The imprint apparatus 200 according to the second embodiment includes a change unit 26 and second measuring unit 27, in addition to the constituent units of the imprint apparatus 100 according to the first embodiment. Also, the imprint apparatus 200 controls not only the deformation amount of a pattern surface 6 but also the distortion of the pattern surface 6 to target amounts. Note that the imprint apparatus 200 according to the second embodiment has already calibrated the first control profile described in the first embodiment.

A plurality of alignment marks are formed on a mold 5. A plurality of alignment marks are also formed on a substrate 8 for each shot region in correspondence with the positions of the alignment marks on the mold 5. Note that the plurality of alignment marks formed on the substrate 8 can also be substituted with a plurality of alignment marks formed on a reference plate arranged on a substrate stage 1.

The change unit 26 changes the distortion of the pattern surface 6 by applying a second force to the mold 5. An actuator such as a piezoelectric element is used as the change unit 26. By changing the amount of actuation of the actuator, a second force is applied from the side surface of the mold 5 so that the distortion of the pattern surface 6 can be changed.

The second measuring unit 27 simultaneously detects the pluralities of alignment marks formed on the mold 5 and substrate 8, respectively, and therefore includes a plurality of detectors 9. The substrate stage 1 is moved so that each alignment mark formed on the substrate 8 overlaps the corresponding alignment mark formed on the mold 5 to allow each detector 9 to detect the relative position between these corresponding alignment marks. The second measuring unit 27 measures the distortion of the pattern surface 6 of the mold 5 from the detection result (the relative position between the corresponding alignment marks) obtained by the detector 9.

A control unit 23 controls not only a deforming unit 21 and first measuring unit 22 together, as described in the first embodiment, but also the deforming unit 21 and second measuring unit 27 together. The control unit 23 controls the second measuring unit 27 to measure the distortion of the pattern surface 6 while each of a plurality of first forces is applied to the mold 5 by the deforming unit 21.

A calculation unit 24 calculates not only the rate of change in deformation amount of the pattern surface 6, described in the first embodiment, but also that in distortion of the pattern surface 6. The calculation unit 24 calculates the rate of change in distortion of the pattern surface 6 as a function of the change in first force applied to the mold 5, based on the relationship between each of a plurality of first forces applied to the mold 5 and the distortion of the pattern surface 6 corresponding to each of the plurality of first forces.

A calibration unit 25 calibrates not only the first control profile, described in the first embodiment, but also a second control profile. The second control profile represents the relationship between the time in an imprint process, and the second force to be applied to the mold 5 by the change unit 26 at this time. The second control profile is calibrated based on the rate of change in distortion of the pattern surface 6 calculated by the calculation unit 24, so that the distortion of the pattern surface 6 becomes a target amount in an imprint process. With this operation, even if the thickness of each mold 5 varies, an imprint process can be performed upon calibrating the distortion of the pattern surface 6 of each mold 5 to a target amount.

An example of an imprint process by the imprint apparatus 200 according to the second embodiment will be described below. In this case, a mold 5 actually used in an imprint process is defined as a mold A. Also, the amount of actuation of the actuator is regarded to be equivalent to the second force applied to the mold A. Note that the imprint apparatus 200 according to the second embodiment has already calibrated the first control profile as in the imprint apparatus 100 according to the first embodiment.

Figure 10:
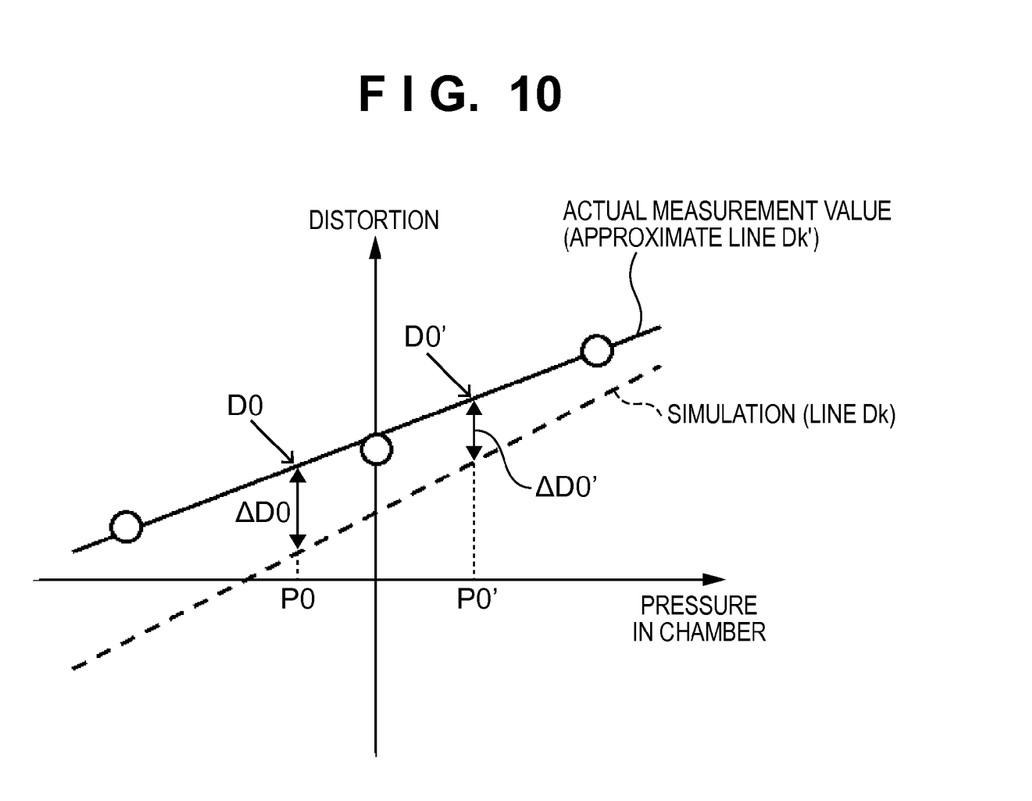
FIG. 10 is a graph showing the relationship between the pressure in a chamber and the distortion of a pattern surface in the imprint apparatus according to the second embodiment of the present invention.

While the pressure in a chamber 3 is set to a first pressure P1 by the deforming unit 21, the second measuring unit 27 measures a distortion D1 of the pattern surface 6 of the mold A. Similarly, the second measuring unit 27 measures a distortion D2 of the pattern surface 6 while the pressure in the chamber 3 is set to a second pressure P2, and a distortion D3 of the pattern surface 6 while the pressure in the chamber 3 is set to a third pressure P3. FIG. 10 shows the relationship between the three pressures P1, P2, and P3 in the chamber 3, and the corresponding distortions D1, D2, and D3 of the pattern surface 6. FIG. 10 shows the pressure in the chamber 3 on the abscissa, and the distortion of the pattern surface 6 on the ordinate. Note that the distortion means the deformation amount (including magnification, skew, and other trapezoidal components) of the pattern surface 6 of the mold 5 in the in-plane direction. Although the pressures P1, P2, and P3 in the chamber 3 are the same as those described in the first embodiment, the former may be different from the latter.

The distortion (target amount) of the pattern surface 6 of a reference mold (thickness: 1.1 mm) when a pressure is applied to the chamber 3 to deform the pattern surface 6 is calculated by simulation. As a result, the pressure in the chamber 3 and the distortion of the pattern surface 6 have an approximately linear relationship. Accordingly, the calculation unit 24 can calculate a rate of change (approximate line) Dk' of the distortion of the pattern surface 6 as a function of the change in pressure of the chamber 3 by approximating the three actual measurement values shown in FIG. 10 by a line. Also, the calculation unit 24 can calculate the distortion of the pattern surface 6 at the pressure in the chamber 3, at which the deformation amount of the pattern surface 6 is set to the target amount, based on the approximate line. As described in the first embodiment, the pressure in the chamber 3, at which the deformation amount of the pattern surface 6 is set to the target amount, is P0 and P0', so the distortion of the pattern surface 6 is D0 and D0' when the pressure in the chamber 3 is P0 and P0', respectively. Note that FIG. 10 shows the simulation result of the reference mold together with the approximate line Dk' of the actual measurement value, which is defined as a line Dk.

The calibration unit 25 calibrates the second control profile using the approximate line Dk' calculated by the calculation unit 24, and the distortions D0 and D0' of the pattern surface 6, so that the distortion of the pattern surface 6 becomes a target amount in an imprint process. Until the mold 5 comes into contact with the resin 12 at the time of imprinting, the pressure P0' is applied to the chamber 3, and the distortion of the pattern surface 6 of the mold A is D0'. Hence, the distortion of the pattern surface 6 of the reference mold is calculated from the line Dk when the chamber 3 has the pressure P0', and its difference ΔD0' from the distortion D0' is corrected by the amount of actuation of the actuator. Similarly, in filling the pattern of the mold 5 with the resin 12, the pressure P0 is applied to the chamber 3, and the distortion of the pattern surface 6 of the mold A is D0. Hence, the distortion of the pattern surface 6 of the reference mold is calculated from the line Dk when the chamber 3 has the pressure P0, and its difference ΔD0 from the distortion D0 is corrected by the amount of actuation of the actuator. In the period from when the mold 5 comes into contact with the resin 12 until the start of filling the pattern of the mold A with the resin 12 at the time of imprinting, and at the time of release, the rate of change in amount of actuation of the actuator is changed based on the slope of the approximate line Dk'.

In the second embodiment, the distortion of the pattern surface 6 is measured while each of a plurality of second forces is applied to the mold 5. Also, the relationship between each of a plurality of second forces applied to the mold 5 and the distortion of the pattern surface 6 corresponding to each of the plurality of second forces is obtained. The rate of change in distortion of the pattern surface 6 as a function of the change in second force applied to the mold 5 is calculated from this relationship. A second control profile describing the relationship between the time in an imprint process, and the second force to be applied to the mold 5 at this time is calibrated based on the calculated rate of change in distortion of the pattern surface 6. With this operation, even if the thickness of each mold 5 varies, an imprint process can be performed using the same distortion as in the reference mold. Although the line Dk for the reference mold is determined from the simulation result in the second embodiment, it may be determined from an actual measurement value. Also, although the imprint apparatus 200 according to the second embodiment has already calibrated the first control profile as in the imprint apparatus 100 according to the first embodiment, it may simultaneously calibrate the first and second control profiles.

Embodiment of Method of Manufacturing Article

A method of manufacturing an article according to an embodiment of the present invention is suitable for manufacturing various articles including a microdevice such as a semiconductor device and an element having a microstructure. This method includes a step of forming a pattern on a resin, dispensed on a substrate, using the above-mentioned imprint apparatus (a step of performing an imprint process on a substrate), and a step of developing the substrate having the pattern formed on it in the forming step. This method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-024521 filed on Feb. 7, 2012, which is hereby incorporated by reference herein in its entirety.

The invention claimed is:

1. An imprint apparatus which forms a pattern of an imprint material on a substrate held by a substrate stage, by using a mold having a pattern surface, the apparatus comprising:
  a deforming unit configured to deform the pattern surface by applying a first force to the mold;
  a first measuring unit configured to be placed on the substrate stage and measure a deformation amount of the pattern surface deformed by the deforming unit in a vertical direction;
  a control unit configured to control the first measuring unit to measure the deformation amount of the pattern surface in each of a plurality of states in which a plurality of first forces are applied to the mold by the deforming unit;
  a calculation unit configured to calculate a rate of change in deformation amount of the pattern surface as a function of a change in first force applied to the mold by the deforming unit, based on a relationship between each of the plurality of first forces applied to the mold and the deformation amount of the pattern surface corresponding to each of the plurality of first forces; and
  a calibration unit configured to calibrate a first control profile describing the relationship between a time in the imprint process and a first force to be applied to the mold by the deforming unit, based on the rate of change in deformation amount of the pattern surface calculated by the calculation unit, so that the deformation amount of the pattern surface in the imprint process becomes a target amount.

2. The apparatus according to claim 1, wherein
  each of the mold and the substrate includes an alignment mark,
  the imprint apparatus further comprises:
  a change unit configured to change a distortion of the pattern surface by applying a second force to the mold; and
  a second measuring unit configured to measure the distortion of the pattern surface by detecting a relative position between the alignment mark on the mold and the alignment mark on the substrate,
  the control unit further controls the second measuring unit to measure the distortion of the pattern surface in each of a plurality of states in which a plurality of first forces are applied to the mold by the deforming unit,
  the calculation unit further calculates a rate of change in distortion of the pattern surface as a function of a change in first force applied to the mold by the deforming unit, based on a relationship between each of the plurality of first forces applied to the mold and the distortion of the pattern surface corresponding to each of the plurality of first forces, and the calibration unit further calibrates a second control profile describing the relationship between a time in the imprint process and a second force to be applied to the mold by the change unit, based on the rate of change in distortion of the pattern surface calculated by the calculation unit, so that the distortion of the pattern surface in the imprint process becomes a target amount.

3. The apparatus according to claim 2, wherein the change unit changes the distortion of the pattern surface using an actuator configured to apply a force to a side surface of the mold.

4. The apparatus according to claim 2, wherein the change unit applies the second force to the mold in accordance with the second control profile calibrated by the calibration unit.

5. The apparatus according to claim 1, wherein the calibration unit calibrates the first control profile while the pattern of the mold is brought into contact with the imprint material.

6. The apparatus according to claim 1, wherein the calibration unit calibrates the first control profile while the mold is separated from the cured imprint material.

7. The apparatus according to claim 1, further comprising:
a holding unit having a holding surface configured to hold the mold,
wherein the deforming unit deforms the pattern surface using a pressure in a chamber between the holding surface and a surface of the mold on a side of the holding surface.

8. The apparatus according to claim 1, wherein the deforming unit applies the first force to the mold in accordance with the first control profile calibrated by the calibration unit.

9. The apparatus according to claim 1, wherein the deformation amount measured by the first measurement unit is a difference between a position of a central portion of the pattern surface of the mold in the vertical direction when the pattern surface is flat and a position of the central portion in the vertical direction when the pattern surface is deformed by the deforming unit.

10. The apparatus according to claim 1, further comprising a substrate stage configured to hold the substrate, wherein the first measurement unit is provided to the substrate stage.

11. A method of manufacturing an article, the method comprising:
performing forming a pattern of a resin on a substrate using an imprint apparatus; and
processing the substrate, on which the forming has been performed, to manufacture the article,
wherein the imprint apparatus forms a pattern of the resin on the substrate held by a substrate stage, by using a mold having a pattern surface, the apparatus comprising:
a deforming unit configured to deform the pattern surface by applying a first force to the mold;

a first measuring unit configured to be placed on the substrate stage and measure a deformation amount of the pattern surface deformed by the deforming unit in a vertical direction;

a control unit configured to control the first measuring unit to measure the deformation amount of the pattern surface in each of a plurality of states in which a plurality of first forces are applied to the mold by the deforming unit;

a calculation unit configured to calculate a rate of change in deformation amount of the pattern surface as a function of a change in first force applied to the mold by the deforming unit, based on a relationship between each of the plurality of first forces applied to the mold and the deformation amount of the pattern surface corresponding to each of the plurality of first forces; and a calibration unit configured to calibrate a first control profile describing the relationship between a time in the imprint process and a first force to be applied to the mold by the deforming unit, based on the rate of change in deformation amount of the pattern surface calculated by the calculation unit, so that the deformation amount of the pattern surface in the imprint process becomes a target amount.

12. An imprint apparatus which forms a pattern of an imprint material on a substrate held by a substrate stage, by using a mold having a pattern surface, the apparatus comprising:
a deforming unit configured to deform the pattern surface by applying a force to the mold;
a measuring unit configured to be placed on the substrate stage and measure a deformation amount of the pattern surface deformed by the deforming unit in a vertical direction;
a calibration unit configured to perform a calibration to generate a control profile for controlling a force to be applied to the mold by the deforming unit in the imprint process, based on a relationship between a predetermined force applied to the mold by the deforming unit and the deformation amount of the pattern surface measured by the measurement unit when the predetermined force is applied to the mold by the deforming unit.

13. The apparatus according to claim 12, wherein the deformation amount measured by the measurement unit is a difference between a position of a central portion of the pattern surface of the mold in the vertical direction when the pattern surface is flat and a position of the central portion in the vertical direction when the pattern surface is deformed by the deforming unit.

14. The apparatus according to claim 12, further comprising a substrate stage configured to hold the substrate, wherein the measurement unit is provided to the substrate stage.

* * * * *